United States Patent
Rops et al.

(10) Patent No.: US 12,287,580 B2
(45) Date of Patent: Apr. 29, 2025

(54) FLUID HANDLING SYSTEM, METHOD AND LITHOGRAPHIC APPARATUS

(71) Applicant: ASML NETHERLANDS B.V., Veldhoven (NL)

(72) Inventors: Cornelius Maria Rops, Waalre (NL); Christianus Wilhelmus Johannes Berendsen, Eindhoven (NL); Erik Henricus Egidius Catharina Eummelen, Veldhoven (NL); Dagmar Antoinette Wismeijer, Zeist (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1 day.

(21) Appl. No.: 18/015,522

(22) PCT Filed: Jun. 14, 2021

(86) PCT No.: PCT/EP2021/065976
§ 371 (c)(1),
(2) Date: Jan. 10, 2023

(87) PCT Pub. No.: WO2022/012830
PCT Pub. Date: Jan. 20, 2022

(65) Prior Publication Data
US 2023/0259037 A1   Aug. 17, 2023

(30) Foreign Application Priority Data

Jul. 14, 2020   (EP) .................................. 20185608

(51) Int. Cl.
*B06B 1/06*   (2006.01)
*G03F 7/00*   (2006.01)

(52) U.S. Cl.
CPC ........ *G03F 7/70341* (2013.01); *B06B 1/0644* (2013.01)

(58) Field of Classification Search
CPC .......................... G03F 7/70341; B06B 1/0644
See application file for complete search history.

(56) References Cited

U.S. PATENT DOCUMENTS

| 5,610,683 A | * | 3/1997 | Takahashi | ........... G03F 7/70341 355/53 |
| 6,952,253 B2 | | 10/2005 | Lof et al. | |

(Continued)

FOREIGN PATENT DOCUMENTS

| WO | 99/49504 | 9/1999 |
| WO | 2008089990 | 7/2008 |

OTHER PUBLICATIONS

International Search Report and Written Opinion issued in the corresponding International Application No. PCT/EP2021/065976 dated Sep. 20, 2021.

(Continued)

*Primary Examiner* — Hung V Nguyen
(74) *Attorney, Agent, or Firm* — Pillsbury Winthrop Shaw Pittman, LLP

(57) ABSTRACT

A lithographic apparatus has a substrate holder configured to hold a substrate and a projection system configured to project a radiation beam onto the substrate held by the substrate holder. There is also a fluid handling system configured to confine immersion liquid to a space between a part of the projection system and a surface of the substrate so that the radiation beam can irradiate the surface of the substrate by passing through the immersion liquid. An excitation device is provided to generate surface acoustic waves in the substrate and propagating toward the immersion liquid.

21 Claims, 7 Drawing Sheets

(56) References Cited

U.S. PATENT DOCUMENTS

| | | | |
|---|---|---|---|
| 7,199,874 B2 | 4/2007 | Bevis et al. | |
| 8,564,759 B2* | 10/2013 | Chang | B08B 3/12 |
| | | | 355/53 |
| 9,829,799 B2* | 11/2017 | Kolesnychenko | G03F 7/70866 |
| 2005/0213065 A1* | 9/2005 | Kitaoka | G03B 27/42 |
| | | | 355/53 |
| 2006/0103816 A1 | 5/2006 | Belfroid et al. | |
| 2009/0009734 A1 | 1/2009 | Belfroid et al. | |
| 2011/0292357 A1 | 12/2011 | Van Der Ham et al. | |
| 2012/0320356 A1* | 12/2012 | Sepkhanov | G03F 7/706 |
| | | | 359/287 |
| 2016/0195821 A1 | 7/2016 | Riepen et al. | |

OTHER PUBLICATIONS

Peter Shull et al., 'Ultrasound' in "Nondestructive Evaluation", CRC Press (2002).

* cited by examiner

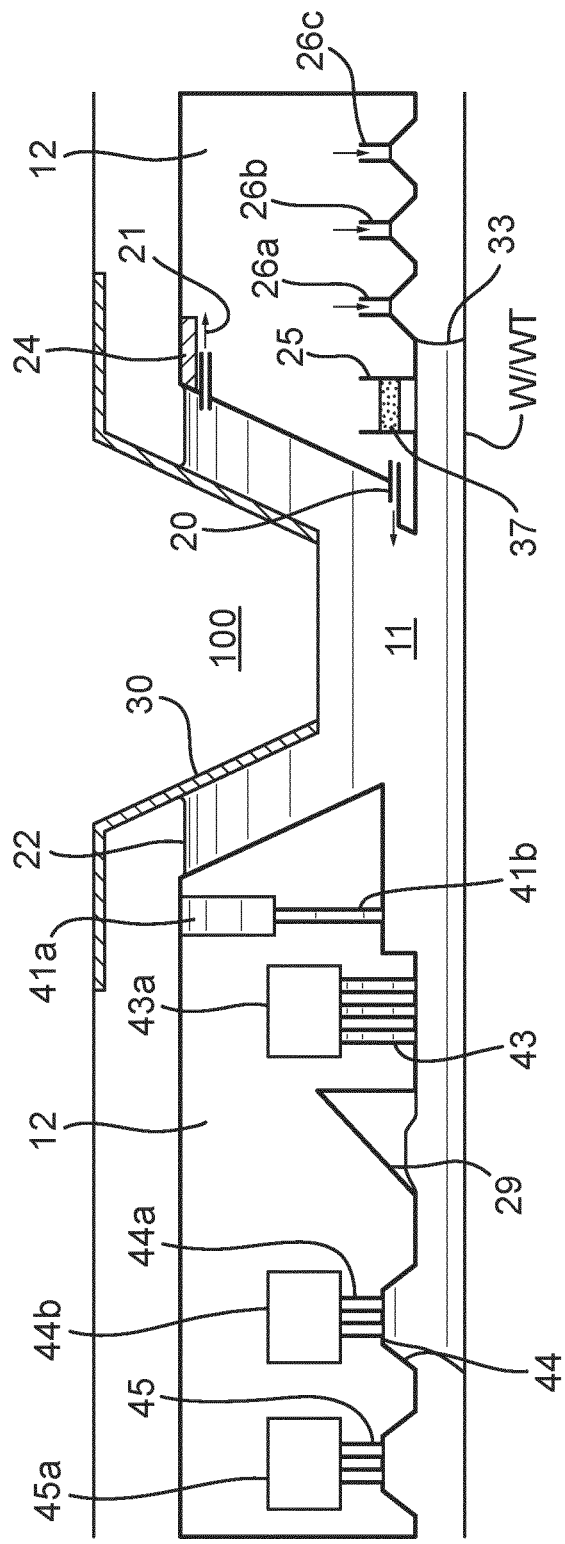

FLUID HANDLING SYSTEM, METHOD AND LITHOGRAPHIC APPARATUS

CROSS-REFERENCE TO RELATED APPLICATIONS

This application is the U.S. national phase entry of PCT application no. PCT/EP2021/065976 which was filed on Jun. 14, 2021, which claims priority of European patent application No. 20185608.5 which was filed on Jul. 14, 2020, and which is incorporated herein in its entirety by reference.

FIELD

The present invention relates to a fluid handling system and a device manufacturing method. The present invention also relates to the lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer). Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Further improvements in the resolution of smaller features may be achieved by providing an immersion fluid having a relatively high refractive index, such as water, on the substrate during exposure. The effect of the immersion fluid is to enable imaging of smaller features since the exposure radiation will have a shorter wavelength in the fluid than in gas. The effect of the immersion fluid may also be regarded as increasing the effective numerical aperture (NA) of the system and also increasing the depth of focus.

The immersion fluid may be confined to a localized area between the projection system of the lithographic apparatus and the substrate by a fluid handling structure. The use of such immersion fluid can lead to the presence of droplets on the surface of the substrate. Such droplets can be an issue because they can cause drying spots on the substrate and because when a droplet hits a meniscus of immersion liquid, this can lead to formation of a bubble due to entrapped gas in the immersion liquid. A bubble in the immersion liquid can lead to printed defects on the substrate. The likelihood of such bubbles being introduced can be reduced by reducing the relative speed of the substrate, however, this limits the throughput of the lithographic apparatus.

SUMMARY

It is an object of the present invention to provide a fluid handling system and method in which measures are taken to increase throughput and/or reduce defects on a substrate.

According to the present invention, there is provided a lithographic apparatus comprising: a substrate holder configured to hold a substrate, a projection system configured to project a radiation beam onto the substrate held by the substrate holder, a fluid handling system configured to confine immersion liquid to a space between a part of the projection system and a surface of the substrate whereby the radiation beam can irradiate the surface of the substrate by passing through the immersion liquid, and an excitation device configured to generate surface acoustic waves in the substrate and propagating toward the immersion liquid.

According to the present invention, there is also provided a device manufacturing method in a lithographic apparatus having a substrate holder configured to hold a substrate, a projection system configure to project a radiation beam onto the substrate held by the substrate holder, and a fluid handling system configured to confine immersion liquid to a space between a part of the projections system and a surface of the substrate whereby the radiation beam can irradiate the surface of the substrate by passing through the immersion liquid, the method comprising:

using the liquid confinement structure to confine immersion liquid to the space between at least a part of the liquid confinement structure and the surface of the substrate;

projecting a patterned beam of radiation onto the substrate through the immersion liquid in the space;

moving the substrate in a scan direction substantially perpendicular to the direction of propagation of the radiation beam; and generating a surface acoustic wave in the substrate that propagates toward the immersion liquid.

According to the present invention, there is also provided an excitation device for use in a lithographic apparatus, the excitation device comprising an electromagnetic device configured to generate eddy currents in a substrate and a static magnetic field perpendicular to the surface of the substrate so as to generate surface acoustic waves in the substrate.

Further embodiments, features and advantages of the present invention, as well as the structure and operation of the various embodiments, features and advantages of the present invention, are described in detail below with reference to the accompanying drawings.

DESCRIPTION OF THE DRAWINGS

Embodiments of the invention will now be described, by way of example only, with reference to the accompanying schematic drawings, in which corresponding reference symbols indicate corresponding parts, and in which:

FIGS. 2a, 2b, 2c and 2d each depict, in cross section, two different versions of a fluid handling system with different features illustrated on the left hand side and the right hand side of each version, which may extend around the complete circumference;

The features shown in the figures are not necessarily to scale, and the size and/or arrangement depicted is not limiting. It will be understood that the figures include optional features which may not be essential to the invention. Furthermore, not all of the features of the apparatus are depicted in each of the figures, and the figures may only show some of the components relevant for describing a particular feature.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
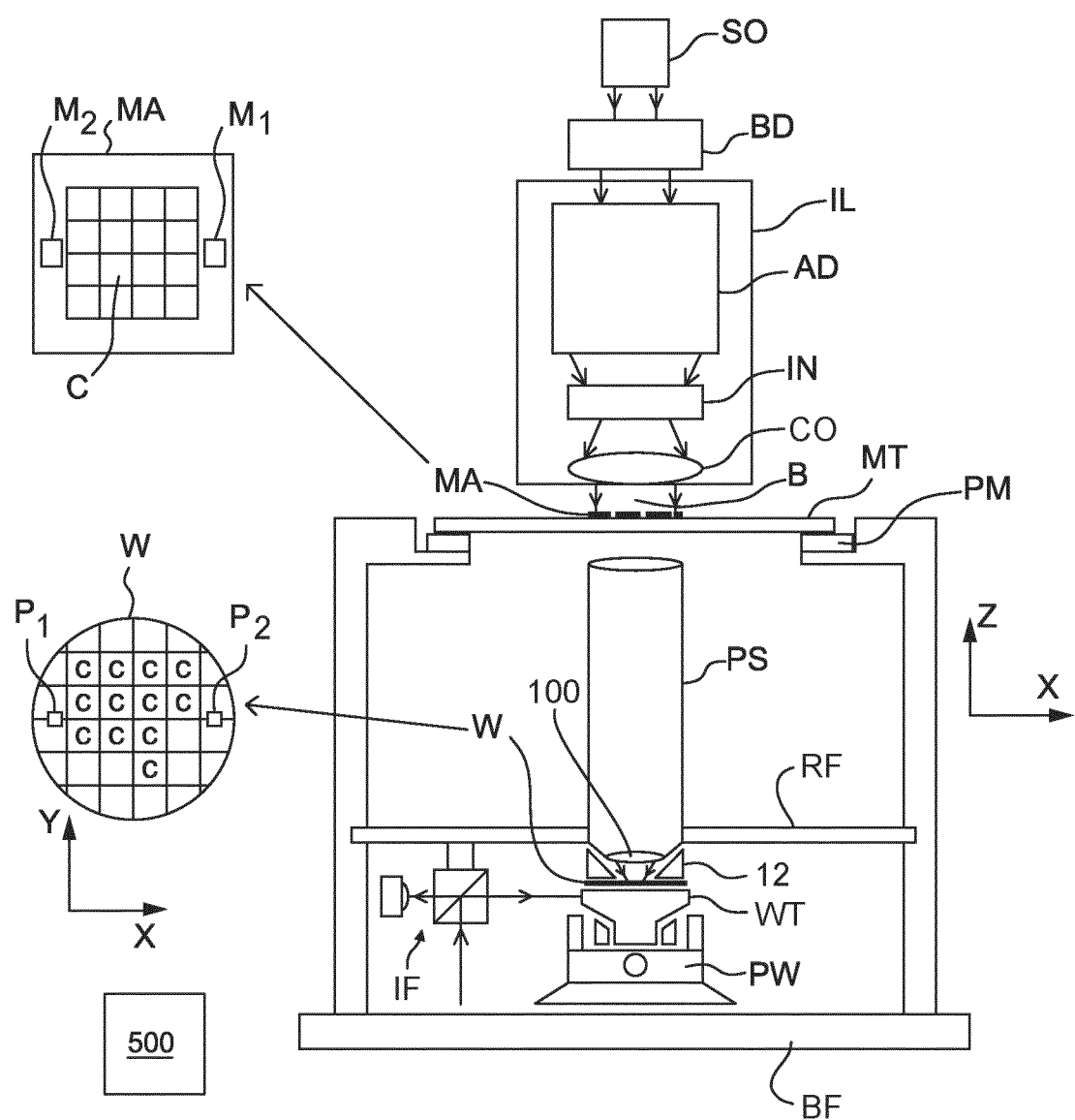
FIG. 1 depicts the schematic overview of the lithographic apparatus.

FIG. 1 schematically depicts a lithographic apparatus. The lithographic apparatus includes an illumination system (also referred to as illuminator) IL configured to condition a radiation beam B (e.g., UV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a substrate table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W. A controller 500 controls the overall operation of the apparatus. Controller 500 may be a centralised control system or a system of multiple separate sub-controllers within various sub-systems of the lithographic apparatus.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus is of a type wherein at least a portion of the substrate W may be covered by an immersion liquid having a relatively high refractive index, e.g., water, so as to fill an immersion space 11 between the projection system PS and the substrate W—which is also referred to as immersion lithography. More information on immersion techniques is given in U.S. Pat. No. 6,952,253, which is incorporated herein by reference.

The lithographic apparatus may be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage (not depicted in figures). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Immersion techniques have been introduced into lithographic systems to enable improved resolution of smaller features. In an immersion lithographic apparatus, a liquid layer of immersion liquid having a relatively high refractive index is interposed in the immersion space 11 between a projection system PS of the apparatus (through which the patterned beam is projected towards the substrate W) and the substrate W. The immersion liquid covers at least the part of the substrate W under a final element of the projection system PS. Thus, at least the portion of the substrate W undergoing exposure is immersed in the immersion liquid.

In commercial immersion lithography, the immersion liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space 11 as immersion liquid. Other liquids with a high refractive index can be used besides water as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the immersion space 11 between the final element 100 and a surface facing the final element 100. The facing surface is a surface of substrate W or a surface of the supporting stage (or substrate support WT) that is co-planar with the surface of the substrate W. (Please note that reference in the following text to surface of the substrate W also refers in addition or in the alternative to the surface of the substrate support WT, unless expressly stated otherwise; and vice versa). A fluid handling structure 12 present between the projection system PS and the substrate support WT is used to confine the immersion liquid to the immersion space 11. The immersion space 11 filled by the immersion liquid is smaller in plan than the top surface of the substrate W and the immersion space 11 remains substantially stationary relative to the projection system PS while the substrate W and substrate support WT move underneath.

Other immersion systems have been envisaged such as an unconfined immersion system (a so-called 'All Wet' immersion system) and a bath immersion system. In an unconfined immersion system, the immersion liquid covers more than the surface under the final element 100. The liquid outside the immersion space 11 is present as a thin liquid film. The liquid may cover the whole surface of the substrate W or even the substrate W and the substrate support WT co-planar with the substrate W. In a bath type system, the substrate W is fully immersed in a bath of immersion liquid.

The fluid handling structure 12 is a structure which supplies the immersion liquid to the immersion space 11, removes the immersion liquid from the immersion space 11 and thereby confines the immersion liquid to the immersion space 11. It includes features which are a part of a fluid supply system. The arrangement disclosed in PCT patent application publication no. WO 99/49504 is an early fluid handling structure comprising pipes which either supply or recover the immersion liquid from the immersion space 11 and which operate depending on the relative motion of the stage beneath the projection system PS. In more recent designs, the fluid handling structure extends along at least a part of a boundary of the immersion space 11 between the final element 100 of the projection system PS and the substrate support WT or substrate W, so as to in part define the immersion space 11.

The fluid handing structure 12 may have a selection of different functions. Each function may be derived from a corresponding feature that enables the fluid handling structure 12 to achieve that function. The fluid handling structure 12 may be referred to by a number of different terms, each referring to a function, such as barrier member, seal member, fluid supply system, fluid removal system, liquid confinement structure, etc.

As a barrier member, the fluid handling structure 12 is a barrier to the flow of the immersion liquid from the immersion space 11. As a liquid confinement structure, the structure confines the immersion liquid to the immersion space 11. As a seal member, sealing features of the fluid handling structure 12 form a seal to confine the immersion liquid to the immersion space 11. The sealing features may include an additional gas flow from an opening in the surface of the seal member, such as a gas knife.

In an embodiment the fluid handling structure 12 may supply immersion fluid and therefore be a fluid supply system.

In an embodiment the fluid handling structure 12 may at least partly confine immersion fluid and thereby be a fluid confinement system.

In an embodiment the fluid handling structure 12 may provide a barrier to immersion fluid and thereby be a barrier member, such as a fluid confinement structure.

In an embodiment the fluid handling structure 12 may create or use a flow of gas, for example to help in controlling the flow and/or the position of the immersion fluid.

The flow of gas may form a seal to confine the immersion fluid so the fluid handling structure 12 may be referred to as a seal member; such a seal member may be a fluid confinement structure.

In an embodiment, immersion liquid is used as the immersion fluid. In that case the fluid handling structure 12 may be a liquid handling system. In reference to the aforementioned description, reference in this paragraph to a feature defined with respect to fluid may be understood to include a feature defined with respect to liquid.

A lithographic apparatus has a projection system PS. During exposure of a substrate W, the projection system PS projects a beam of patterned radiation onto the substrate W. To reach the substrate W, the path of the radiation beam B passes from the projection system PS through the immersion liquid confined by the fluid handling structure 12 between the projection system PS and the substrate W. The projection system PS has a lens element, the last in the path of the beam, which is in contact with the immersion liquid. This lens element which is in contact with the immersion liquid may be referred to as 'the last lens element' or "the final element". The final element 100 is at least partly surrounded by the fluid handling structure 12. The fluid handling structure 12 may confine the immersion liquid under the final element 100 and above the facing surface.

FIGS. 2a, 2b, 2c and 2d show different features which may be present in variations of a fluid handling system. The designs may share some of the same features as FIGS. 2a, 2*b*, 2*c* and 2*d* unless described differently. The features described herein may be selected individually or in combination as shown or as required. The figures depict different versions of a fluid handling system with different features illustrated on the left hand side and the right hand side, which may extend around the complete circumference. Thus, for example, the fluid handling system may have the same features extending around the complete circumference. For example, the fluid handling system may have only the features of the left hand side of FIG. 2*a*, or the right hand side of FIG. 2*a*, or the left hand side of FIG. 2*b*, or the right hand side of FIG. 2*b*, or the left hand side of 2*c*, or the right hand side of 2*c*, or the left hand side of 2*d*, or the right hand side of 2*d*. Alternatively, the fluid handling system may be provided with any combination of features from these figures at different locations around the circumference. The fluid handling system may comprise the fluid handling structure 12 as described in the variations below.

Figure 2A:
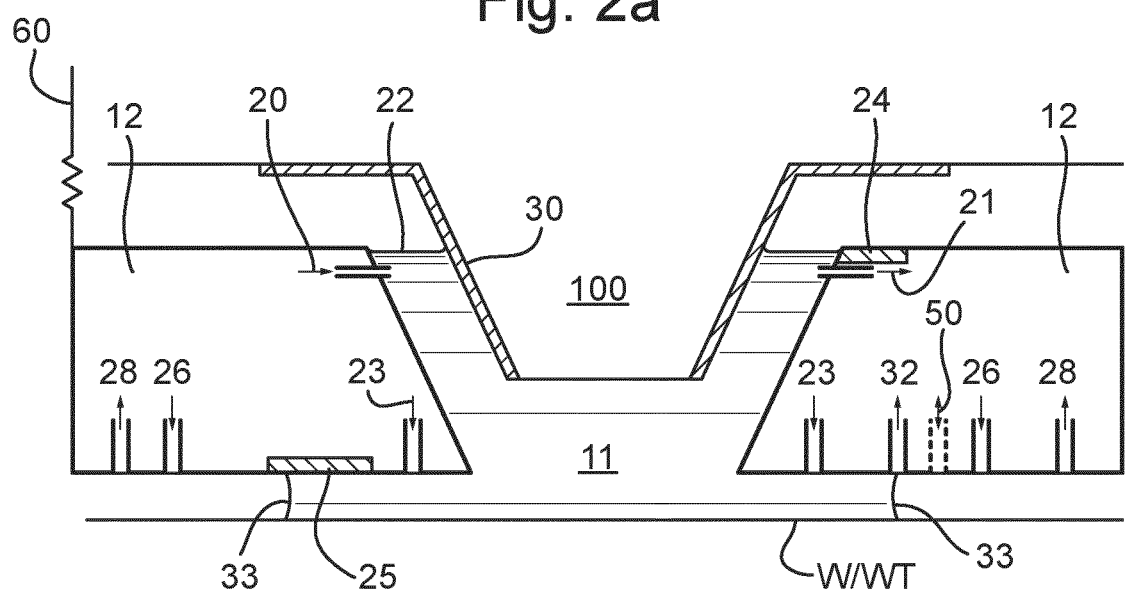

FIG. 2*a* shows a fluid handling structure 12 around the bottom surface of the final element 100. The final element 100 has an inverted frusto-conical shape. The frusto-conical shape having a planar bottom surface and a conical surface. The frusto-conical shape protrudes from a planar surface and having a bottom planar surface. The bottom planar surface is the optically active portion of the bottom surface of the final element 100, through which the radiation beam B may pass. The final element 100 may have a coating 30. The fluid handling structure 12 surrounds at least part of the frusto-conical shape. The fluid handling structure 12 has an inner-surface which faces towards the conical surface of the frusto-conical shape. The inner-surface and the conical surface may have complementary shapes. A top surface of the fluid handling structure 12 may be substantially planar. The fluid handling structure 12 may fit around the frusto-conical shape of the final element 100. A bottom surface of the fluid handling structure 12 may be substantially planar and in use the bottom surface may be parallel with the facing surface of the substrate support WT and/or substrate W. Thus, the bottom surface of the fluid handling structure 12 may be referred to as a surface facing the surface of the substrate W. The distance between the bottom surface and the facing surface may be in the range of 30 to 500 micrometers, desirably in the range of 80 to 200 micrometers.

The fluid handling structure 12 extends closer to the facing surface of the substrate W and substrate support WT than the final element 100. The immersion space 11 is therefore defined between the inner surface of the fluid handling structure 12, the planar surface of the frusto-conical portion and the facing surface. During use, the immersion space 11 is filled with immersion liquid. The immersion liquid fills at least part of a buffer space between the complementary surfaces between the final element 100 and the fluid handling structure 12, in an embodiment at least part of the space between the complementary inner-surface and the conical surface.

The immersion liquid is supplied to the immersion space 11 through an opening formed in a surface of the fluid handling structure 12. The immersion liquid may be supplied through a supply opening 20 in the inner-surface of the fluid handling structure 12. Alternatively or additionally, the immersion liquid is supplied from an under supply opening 23 formed in the bottom surface of the fluid handling structure 12. The under supply opening 23 may surround the path of the radiation beam B and it may be formed of a series of openings in an array or a single slit. The immersion liquid is supplied to fill the immersion space 11 so that flow through the immersion space 11 under the projection system PS is laminar. The supply of the immersion liquid from the under supply opening 23 additionally prevents the ingress of bubbles into the immersion space 11. This supply of the immersion liquid may function as a liquid seal.

The immersion liquid may be recovered from a recovery opening 21 formed in the inner-surface. The recovery of the immersion liquid through the recovery opening 21 may be by application of an under pressure; the recovery through the recovery opening 21 as a consequence of the velocity of the immersion liquid flow through the immersion space 11; or the recovery may be as a consequence of both. The recovery opening 21 may be located on the opposite side of the supply opening 20, when viewed in plan. Additionally or alternatively, the immersion liquid may be recovered through an overflow recovery 24 located on the top surface of the fluid handling structure 12. The supply opening 20 and recovery opening 21 can have their function swapped (i.e. the flow direction of liquid is reversed). This allows the direction of flow to be changed depending upon the relative motion of the fluid handling structure 12 and substrate W.

Additionally or alternatively, immersion liquid may be recovered from under the fluid handling structure 12 through a recovery opening 25 formed in its bottom surface. The recovery opening 25 may serve to hold a meniscus 33 of the immersion liquid to the fluid handling structure 12. The meniscus 33 forms between the fluid handling structure 12 and the facing surface and it serves as border between the liquid space and the gaseous external environment. The recovery opening 25 may be a porous plate which may recover the immersion liquid in a single phase flow. The recovery opening in the bottom surface may be a series of pinning openings 32 through which the immersion liquid is recovered. The pinning openings 32 may recover the immersion liquid in a two phase flow.

Optionally radially outward, with respect to the inner-surface of the fluid handling structure 12, is a gas knife opening 26. Gas may be supplied through the gas knife opening 26 at elevated speed to assist liquid confinement of the immersion liquid in the immersion space 11. The supplied gas may be humidified and it may contain substantially carbon dioxide. Radially outward of the gas knife opening 26 is a gas recovery opening 28 for recovering the gas supplied through the gas knife opening 26.

Further openings, for example open to atmosphere or to a gas source or to a vacuum, may be present in the bottom surface of the fluid handling structure 12, i.e. in the surface of the fluid handling structure 12 facing the substrate W. An example of such an optional further opening 50 is shown in dashed lines on the right hand side of FIG. 2*a*. As shown, the further opening 50 may be a supply or extraction member, which is indicated by the double-headed arrow. For example, if configured as a supply, the further opening 50 may be connected to a liquid supply or a gas supply as with any of the supply members. Alternatively, if configured as an extraction, the further opening 50 may be used to extract fluid, and may for example, be connected to atmosphere or to a gas source or to a vacuum. For example, the at least one further opening 50 may be present between gas knife opening 26 and gas recovery opening 28, and/or between pinning openings 32 and gas knife opening 26.

The two different versions of the fluid handling structure 12 of the left and right sides of FIG. 2*a* pin the meniscus 33. The version of the fluid handling structure 12 on the right hand side of FIG. 2*a* may pin the meniscus 33 at a position that is substantially fixed with respect to the final element 100, due to the fixed position of the pinning opening 32. The version of the fluid handling structure 12 on the left hand side of FIG. 2a may pin the meniscus 33 below the recovery opening 25, and thus the meniscus 33 may move along the length and/or width of the recovery opening 25. For the radiation beam B to be directed to a full side of the substrate W under exposure, the substrate support WT supporting the substrate W is moved relative to the projection system PS. To maximize the output of substrates W exposed by the lithographic apparatus, the substrate support WT (and so substrate W) is moved as fast as possible. However, there is a critical relative speed (often referred to as a critical scan speed) above which the meniscus 33 between the fluid handling structure 12 and the substrate W becomes unstable. An unstable meniscus 33 has a greater risk of losing immersion liquid, for example in the form of one or more droplets. Furthermore, an unstable meniscus 33 has a greater risk of resulting in the inclusion of gas bubbles in the immersion liquid, especially when the confined immersion liquid crosses the edge of the substrate W.

A droplet present on the surface of the substrate W may apply a thermal load and may be a source of defectivity. The droplet may evaporate leaving a drying stain, it may move transporting contamination such as a particle, it may collide with a larger body of immersion liquid introducing a bubble of gas into the larger body and it may evaporate, applying the thermal heat load to the surface on which it is located. Such a thermal load could be a cause of distortion and/or a source of a positioning error if the surface is associated with positioning of components of the lithographic apparatus relative to the substrate W being imaged. A formation of a droplet on a surface is therefore is undesirable. To avoid formation of such a droplet, the speed of the substrate support WT is thus limited to the critical scan speed at which the meniscus 33 remains stable. This limits the throughput of the lithographic apparatus.

The left hand side of the fluid handling system in FIG. 2a may comprise a spring 60. The spring 60 may be an adjustable passive spring configured to apply a biasing force to the fluid handling structure 12 in the direction of the substrate W. Thus, the spring 60 can be used to control the height of the fluid handling structure 12 above the substrate W. Such adjustable passive springs are described in U.S. Pat. No. 7,199,874 which is herein incorporated by reference in its entirety. Other bias devices may also be appropriate, for example, using an electromagnetic force. Although the spring 60 is shown with the left hand side of FIG. 2a, it is optional and does not need to be included with the other features of the left hand side of FIG. 2a. The spring 60 is not shown on any of the other figures, but could also be included with the other variations of the fluid handling system described in relation to FIG. 2a, 2b, 2c, or 2d.

Figure 2B:
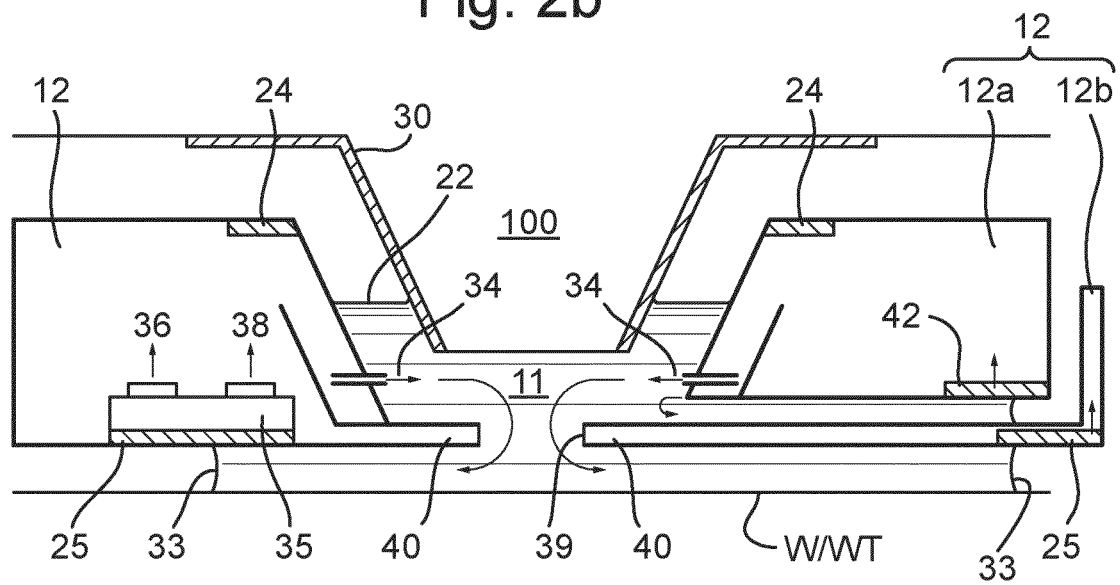

FIG. 2b shows two different versions of the fluid handling structure 12 on its left side and on its right side, which allow movement of the meniscus 33 with respect to the final element 100. The meniscus 33 may move in the direction of the moving substrate W. This decreases the relative speed between the meniscus 33 and the moving substrate W, which may result in improved stability and a reduced risk of breakdown of the meniscus 33. The speed of the substrate W at which the meniscus 33 breaks down is increased so as to allow faster movement of the substrate W under the projection system PS. Throughput is thus increased.

Features shown in FIG. 2b which are common to FIG. 2a share the same reference numbers. The fluid handling structure 12 has an inner surface which complements the conical surface of the frusto-conical shape. The bottom surface of the fluid handling structure 12 is closer to the facing surface than the bottom planar surface of the frusto-conical shape.

Immersion liquid is supplied to the immersion space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B.

Immersion liquid is recovered from the immersion space 11 through recovery openings 25, in the bottom surface of the fluid handling structure 12. As the facing surface moves under the fluid handling structure 12, the meniscus 33 may migrate over the surface of the recovery opening 25 in the same direction as the movement of the facing surface. The recovery openings 25 may be formed of a porous member. The immersion liquid may be recovered in single phase. The immersion liquid may be recovered in a two phase flow. The two phase flow is received in a chamber 35 within the fluid handling structure 12 where it is separated into liquid and gas. The liquid and gas are recovered through separate channels 36, 38 from the chamber 35.

An inner periphery 39 of the bottom surface of fluid handling structure 12 extends into the immersion space 11 away from the inner surface to form a plate 40. The inner periphery 39 forms a small aperture which may be sized to match the shape and size of the radiation beam B. The plate 40 may serve to isolate the immersion liquid at either side of it. The supplied immersion liquid flows inwards towards the aperture, through the inner aperture and then under the plate 40 radially outwardly towards the surrounding the recovery openings 25.

The fluid handling structure 12 may be in two parts as shown on the right hand side of FIG. 2b: an inner part 12a and an outer part 12b. The inner part 12a and the outer part 12b may move relatively to each other, in a plane parallel to facing surface. The inner part 12a may have the supply openings 34 and it may have the overflow recovery 24. The outer part 12b may have the plate and the recovery opening 25. The inner part 12a may have an intermediate recovery 42 for recovering the immersion liquid which flows between the inner part 12a and the outer part 12b.

The two different versions of the fluid handling structure of FIG. 2b thus allow for movement of the meniscus 33 in the same direction as the substrate W, enabling faster scan speeds and increased throughput of the lithographic apparatus. However, the migration speed of meniscus 33 over the surface of the recovery opening 25 in the fluid handling structure 12 of the left side of FIG. 2b may be slow. The fluid handling structure 12 of the right side of FIG. 2b allows for quicker movement of the meniscus 33, by moving the outer part 12b with respect to the inner part 12a and the final element 100. However, it may be difficult to control the intermediate recovery 42 so as to ensure that enough immersion liquid is provided between the inner part 12a and the outer part 12b to prevent contact therebetween.

Figure 2C:
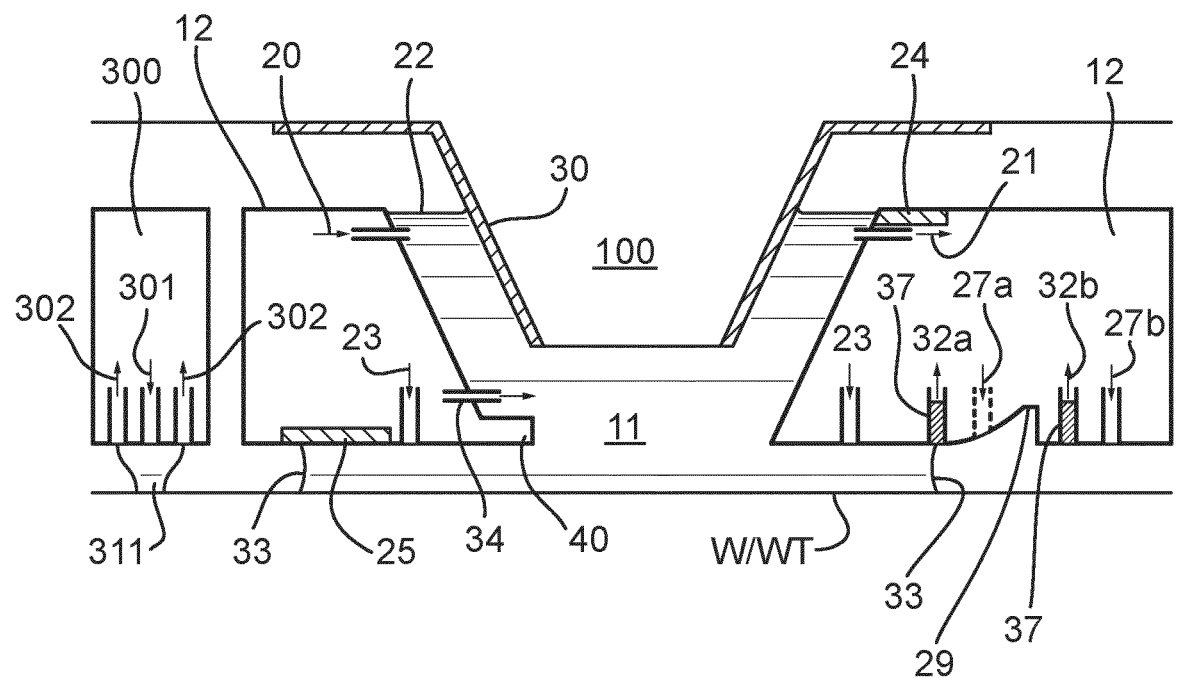

FIG. 2c shows two different versions of the fluid handling structure 12 on its left side and on its right side, which may be used to pin the meniscus 33 of the immersion liquid to the fluid handling structure 12 as described above in relation to FIGS. 2a and/or 2b. Features shown in FIG. 2c which are common to FIGS. 2a and/or 2b share the same reference numbers.

The fluid handling structure 12 has an inner surface which compliments the conical surface of the frusto-chronical shape. The bottom surface of the fluid handling structure 12 is closer to the facing surface than the bottom planar surface of the frusto-chronical shape Immersion liquid is supplied to the immersion space 11 delivered through an opening formed in a surface of the fluid handling structure 12. The immersion liquid may be supplied through a supply opening 34 in the inner surface of the fluid structure 12. Alternatively or additionally, the immersion liquid may be supplied through a supply opening 20 in the inner surface of the fluid structure 12. Alternatively or additionally, the immersion liquid is supplied through the under supply opening 23. The immersion liquid may be recovered via an extraction member, for example, via recovery opening 21 formed in the inner-surface and/or overflow recovery 24 and/or one or more openings in a surface of the fluid handling structure 12 as described below.

The two different versions of the fluid handling structure 12 of the left and right sides of FIG. 2c pin the meniscus 33. The version of the fluid handling structure 12 on the right hand side of FIG. 2c may pin the meniscus 33 at a position that is substantially fixed with respect to the final element 100, due to the fixed position of the recovery opening 32a. The version of the fluid handling structure 12 on the left hand side of FIG. 2c may pin the meniscus 33 below the recovery opening 25, and thus the meniscus 33 may move along the length and/or width of the recovery opening 25.

As described above in relation to FIG. 2b, an inner periphery of the bottom surface of fluid handling structure 12 may extends into the immersion space 11 away from the inner surface to form a plate 40 as shown on the left hand side. As described above, this may form a small aperture, and may isolate the immersion liquid at either side and/or cause immersion liquid to flow inwards towards the aperture, through the inner aperture and then under the plate 40 radially outwardly towards the surrounding the recovery openings 25. Although this features is shown on the left hand side in FIG. 2c, it is optional in combination with the other features shown. Preferably, as shown on the left hand side, immersion liquid is supplied to the immersion space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B. Alternatively or additionally, the immersion liquid may be supplied through a supply opening 20 in the inner surface of the fluid structure 12. Alternatively or additionally, the immersion liquid is supplied through the under supply opening 23. Although the supply openings 34 are the preferred liquid supply, any combination of supply openings 34, supply openings 20 and/or under supply openings 23 may be provided.

As shown on the left hand side of FIG. 2c, a fluid handling system may comprise the fluid handling structure 12 as described above and a further device 300. The fluid handling structure 12 may have an extraction member, such as recovery opening 25, and a liquid supply opening, such as the under supply opening 23. It will be understood that the fluid handling structure 12 may comprise any configuration as disclosed in relation to the left hand of FIG. 2a, the right hand side of FIG. 2a, the left hand side of FIG. 2b, the right hand side of FIG. 2b or (as described below) the right hand side of FIG. 2c, in combination with the further device 300.

The further device 300 may otherwise be referred to as a droplet catcher. The further device 300 is provided to reduce occurrence of liquid on the surface of the substrate W after the fluid handling structure 12 has moved over the surface. The further device 300 may comprise a liquid supply member 301 and at least one extraction member 302. The at least one extraction member 302 may be formed in a shape surrounding the at least one supply member 301 in plan. The at least one liquid supply member 301 may be configured to provide a further liquid to a space 311 between at least a part of the further device 300 and the surface of the substrate W. The further device 300 may be configured to recover at least some of the liquid via the at least one extraction member 302. The further device 300 may be used to incorporate any liquid left on the surface of the substrate W with the liquid in the space 311 and then use the further device 300 to extract the liquid such that the amount of liquid remaining on the surface of the substrate W is reduced.

The further device 300 is shown as a separate device from the fluid handling structure 12 in FIG. 2c. The further device 300 may be positioned adjacent to the fluid handling structure 12. Alternatively, the further device 300 may be part of, i.e. integral to, the fluid handling structure 12 (as in FIG. 3d, however, either arrangement can be selected).

The further device 300 may be configured to provide a liquid to the space 311 which is separate from the liquid provided by the fluid handling structure 12.

Additionally or alternatively, the fluid handling structure 12 may have the components as shown on the right hand side of FIG. 2c. More specifically, the fluid handling structure 12 may comprise the at least one liquid supply member, two extraction members (e.g., recovery openings 32a and 32b) and two gas supply members (e.g., gas supply openings 27a and 27b) formed on the surface of the fluid handling structure 12. Gas supply opening 27a can be omitted, i.e. is optional. The at least one liquid supply member may be the same as the under supply opening 23 in the bottom surface of the fluid handling structure 12 described above or the supply opening 20 or liquid supply openings 34 formed on the inner surface of the fluid handling structure 12 described in relation to left hand side of FIG. 2b. The liquid supply member, the extraction members and the gas supply members may be formed on the surface of the fluid handling structure 12. Specifically, these components may be formed on a surface of the fluid handling structure 12 facing the substrate W, i.e. the bottom surface of the fluid handling structure 12.

At least one of the two extraction members may comprise a porous material 37 therein. The porous material 37 may be provided within an opening, e.g., recovery opening 32a through which fluid handling structure 12 extracts fluid from below the fluid handling structure 12 and may recover the immersion liquid in a single phase flow. The other of the two extraction members, e.g., recovery opening 32b may recover the immersion fluid as a dual phase extractor.

Specifically, the fluid handling structure 12 may comprise the liquid supply member (e.g., under supply opening 23), with a first extraction member (e.g., recovery opening 32a) radially outwards of the liquid supply member, and a first gas supply member (e.g., gas supply opening 27a) radially outwards of the first extraction member, and the second extraction member (e.g., recovery opening 32b) radially outwards of the first gas supply member, and a second gas supply member (e.g., gas supply opening 27b) radially outwards of the second extraction member. Similar to FIG. 2a, further openings, for example open to atmosphere or to a gas source or to a vacuum, may be present in the bottom surface of the fluid handling structure 12 as described previously (in relation to the fluid handling structure 12).

For example, at least one further opening (not shown) may be provided in the bottom surface of the fluid handling structure 12. The further opening is optional. The further opening may be arranged between the first extraction member (e.g., recovery opening 32a) and the first gas supply member (e.g., gas supply opening 27a) as described in the arrangement above. Alternatively or additionally, the further opening may be arranged between the second extraction member (e.g., recovery opening 32b) and the second gas supply member (e.g., gas supply opening 27b) as described in the arrangement above. The further opening may be the same as further opening 50 described above.

Optionally, the fluid handling structure 12 comprises a recess 29. The recess 29 may be provided between the recovery opening 32a and recovery opening 32b or gas supply opening 27a and recovery opening 32b. The shape of the recess 29 may be uniform around the fluid handling structure 12 and may optionally contain an inclined surface. In the case of the recess 29 provided between the recovery opening 32a and recovery opening 32b, the gas supply opening 27b may be provided on the inclined surface as shown in FIG. 2c. In the case of the recess 29 provided between the supply opening 27a and recovery opening 32b, the gas supply opening 27b may be provided on the inclined surface or a part of the bottom surface of the fluid handling structure 12 which is parallel to the surface of the substrate W. Alternatively, the shape of the recess 29 may vary around the circumference of the fluid handling structure 12. The shape of the recess 29 may be varied to alter the impact of gas supplied from the gas supply members on the fluid below the fluid handling structure 12.

FIG. 2d shows, in its left and right halves, two different versions of the fluid handling structure 12. The fluid handling structure 12 of the left half of FIG. 2d has a liquid injection buffer 41a, which holds a buffer amount of immersion liquid, and liquid injection holes 41 which supply immersion liquid from the liquid injection buffer to the space 11. Outwardly of the liquid injection holes 41 are inner liquid recovery apertures 43 for conducting liquid to an inner recovery buffer 43a which is provided with a porous member. A recess 29 similar to that described relating to FIG. 2c is provided outward of the inner liquid recovery apertures 43. Outward of the recess 29, in the lower face of the fluid handling structure 12 is a gas guiding groove 44 into which open outer recovery holes 44a. The outer recovery holes 44a lead a two-phase recovery flow to outer recovery buffer 44b which is also provided with a porous member. Outermost are gas sealing holes 45 which communicate between a gas sealing buffer volume 45a and the space underneath the fluid handling structure 12 to provide a gas flow to contain the immersion liquid.

The fluid handling structure 12 of the right half of FIG. 2d has a liquid supply opening 20 in the inner inclined face thereof. In the underside of the fluid handling structure 12 there are (from inner side to outer side) an extraction opening 25 provided with a porous member 37; a first gas knife opening 26a, a second gas knife opening 26b and a third gas knife opening 26c. Each of these openings opens into a groove in the underside of the fluid handling structure 12 that provides a buffer volume. The outermost part of the fluid handling structure 12 is stepped so as to provide a greater separation between the fluid handling structure 12 and the substrate W.

FIGS. 2a-2d show examples of different configurations which can be used as part of a fluid handling system. It will be understood that the examples provided above refer to specific extraction members and recovery members, but it is not necessary to use the exact type of extraction member and/or recovery member. In some cases different terminology is used to indicate the position of the member, but the same functional features may be provided. Examples of the extraction member referred to above include recovery opening 21, overflow recover 24, recovery opening 25 (possibly comprising a porous plate and/or the chamber 35), gas recovery opening 28, pinning opening 32, recovery opening 32a, recovery opening 32b and/or the intermediate recovery 42. Examples of the supply member referred to above include supply opening 20, under supply opening 23, gas knife opening 26, gas supply opening 27a, gas supply opening 27b, and/or supply openings 34. In general, an extraction member used to extract/recover fluid, liquid or gas is interchangeable with at least any of the other examples used which extract/recover fluid, liquid or gas respectively. Similarly, a supply member used to supply fluid, liquid or gas is interchangeable with at least any of the other examples used which supply fluid, liquid or gas respectively. The extraction member may extract/recover fluid, liquid or gas from a space by being connected to an under pressure which draws the fluid, liquid or gas into the extraction member. The supply member may supply fluid, liquid or gas to the space by being connected to a relevant supply.

As previously described, although use of immersion fluid/liquid is beneficial for improving resolution of smaller features on a substrate, there are also issues with the use of immersion fluid/liquid relating to defects being introduced on the substrate.

In general, when immersion liquid is used, droplets of the immersion liquid may be left behind on the surface of the substrate W. The meniscus 33 at the edge of the immersion liquid may collide with any droplets on the surface of the substrate W. When a droplet hits the meniscus 33, gas may be entrapped within the immersion liquid. This results in a bubble in the immersion liquid. Formation of bubbles in the immersion liquid can lead to defects on the substrate W. Droplets that remain on the surface of the substrate W may cause drying spots and/or affect the chemical properties of the resist, also leading to defects.

It is known that the incidence of droplets increases with speed of movement of the substrate W relative to the fluid handling system. In some cases there is no or negligible droplet formation below a critical scan speed and significant droplet formation above the critical scan speed. The critical scan speed is related to the static receding contact angle between the immersion liquid and the resist provided on the substrate W. Increasing the static receding contact angle increases the critical scan speed. Since the critical scan speed may be a limiting factor on throughput of the lithographic apparatus it is desirable to increase the critical scan speed. Efforts to increase the critical scan speed have included increasing the static receding contact angle by changing the formulation of the resists or by providing a top coat above the resist. However, further improvements are desirable.

The present invention should help reduce the effects of at least one droplet related issue. The present invention includes various embodiments of a droplet mitigation system which may be used in all types of localised immersion lithography apparatus.

Figure 3:
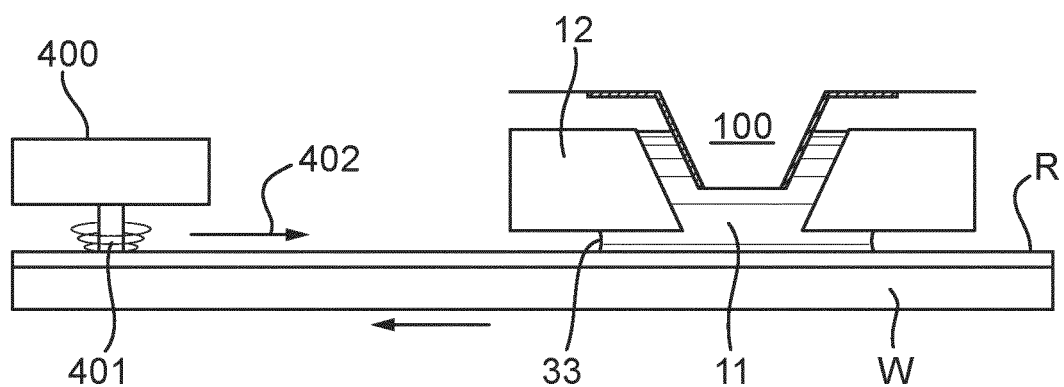
FIG. 3 depicts schematically a droplet mitigations system according to an embodiment.

A droplet mitigation system according to an embodiment is depicted in FIG. 3. This figure shows the substrate W provided with a resist coating R and a fluid handling structure 12 that confines an immersion liquid 13 to a space 11 between the projection system 100 and the substrate W. Fluid handling structure 12 can be any of the various forms of such structure disclosed above with reference to FIGS. 2a to 2d or indeed any other system that localises immersion liquid beneath the projection system 100. A meniscus 33 forms the boundary between the immersion liquid and the surrounding atmosphere.

The droplet mitigation system comprises an excitation device 400 that is configured to generate surface acoustic waves 402 in the substrate W that propagate toward the immersion liquid 13. The surface acoustic waves may have a frequency greater than 1 MHz, desirably greater than 10 MHz, more desirably greater than 50 MHz. The wavelength of the surface acoustic waves 402 is determined by their frequency and the speed of sound in the substrate W. For a typical silicon substrate the speed of sound is about 5,800 $ms^{-1}$ so a surface acoustic wave of frequency 100 MHz will have a wavelength of about 58 µm. Wavelengths of about 10 to 100 µm have been found to be suitable. The surface acoustic waves 402 are travelling waves not standing waves.

Figure 4:
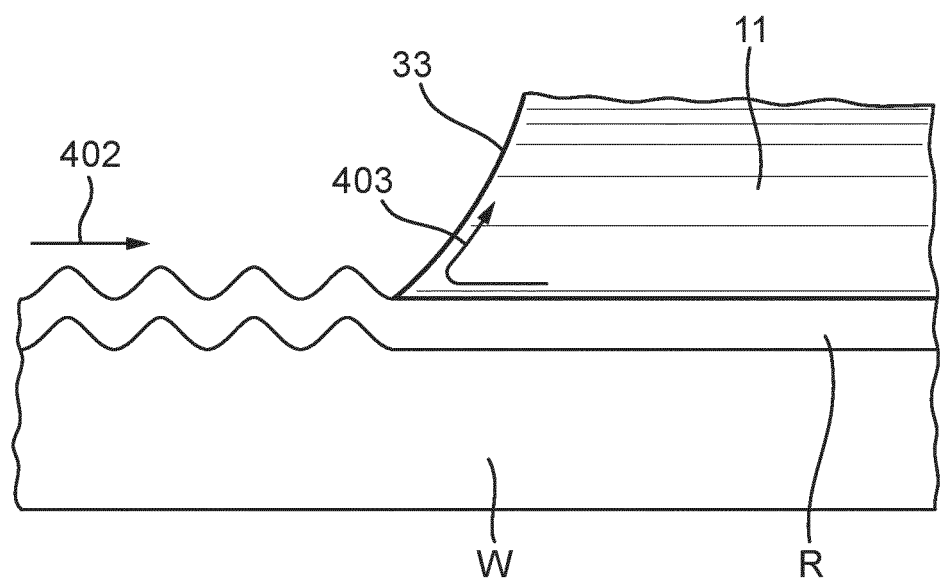
FIG. 4 depicts schematically a principle of operation of a droplet mitigations system according to an embodiment.

The surface acoustic waves 402 propagate toward the meniscus 33. When the substrate W is moving relative to the fluid handling structure 12 in the leftward direction as shown in FIG. 3, the meniscus 33 is drawn with it, as shown in FIG. 4. Note that in immersion lithography movements of the substrate W relative to the fluid handling system 12 are often described from a point of view where the substrate W is static and the fluid handling system is moving. On this basis the meniscus 33 depicted in FIG. 4 may be referred to as the trailing meniscus.

The movement of the substrate W generates a shear force in the leftward direction close to the surface of the substrate (W) whilst the surface tension in the meniscus 33 creates a pressure gradient further away from the surface of the substrate (W) which causes a flow in the rightward direction. Below the critical scan speed, these effects result in a flow 403 of the immersion liquid 13 that moves leftward close to the substrate W turns in the corner of the meniscus 33 and moves up and back into the main body of the immersion liquid 13. This flow 403 allows the meniscus 33 to move relative to the substrate W and stay still relative to the fluid handling system. However, above the critical scan speed the pressure gradient created by surface tension in the meniscus 33 is insufficient to turn around all of flow 403 and droplets may break away from the meniscus 33.

The effect of the surface acoustic waves 402 when interacting with the meniscus 33 is to provide an additional force in the immersion liquid 13 away from the surface of the substrate (W) and towards the centre of the immersion liquid 13. The surface acoustic waves 402 may therefore prevent or reduce the formation of droplets when the substrate W is moving at or above the critical speed. Therefore it is possible to operate at a higher scan speed without increasing defects. Thus throughput can be increased with detrimental effect on yield.

It should be noted that the amplitude of the surface acoustic wave 402 is greatly exaggerated in FIG. 4 and may only be about 0.01 µm in a practical application. A suitable amplitude can be determined, e.g. by trial and error, that has a useful effect without causing damage to any structures that may be present on the substrate W due to previous manufacturing steps. The inventors have determined that the energy of the surface acoustic wave 402 is coupled into the immersion liquid 13 over a very short distance and does not affect the patterning of the substrate W.

A variety of different means may be used to generate the surface acoustic waves 402. A preferred form of excitation device 400 comprises an electromagnetic device configured to generate eddy currents in the substrate W and a static magnetic field 401 parallel to the surface of the substrate W (referring to FIG. 3). The eddy currents generated are alternating and perpendicular to the static magnetic field 401 so as to interact with the static magnetic field 401 to exert alternating forces on the substrate W perpendicular to its surface.

Figure 5:
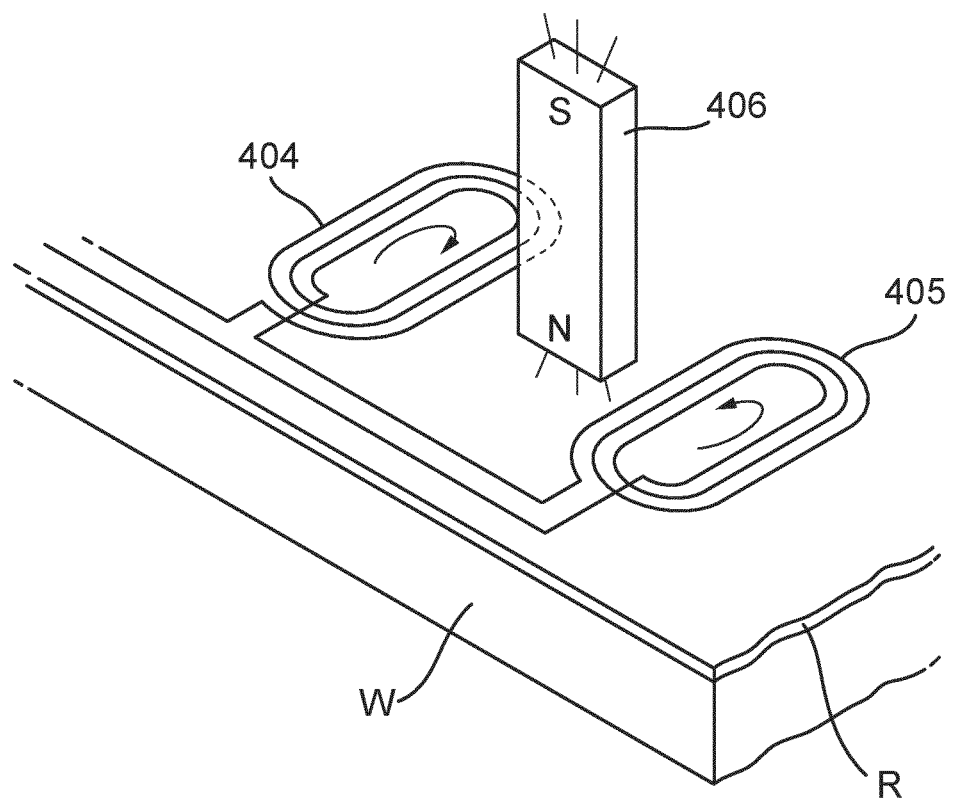
FIG. 5 depicts schematically an excitation device usable in an embodiment.

As shown in FIG. 5, the electromagnetic device may comprise a pair of coils 404, 405 positioned either side of a magnet 406. Alternating drive currents passed through the coils 404, 405 generate eddy currents in respective regions below each coil 404, 405. The winding direction of the coils 404, 405 and phase of the drive currents can be selected so that the forces exerted on the substrate W below the coils 404, 405 are always in opposite directions to enhance the wave generation effect. An electromagnetic excitation device of this type works well with silicon substrates and also other substrates used in semiconductor manufacturing, e.g. GaAs, GaN and SiC.

The excitation device 400 can be mounted at any convenient location. Desirably, the excitation device 400 is mounted to the fluid handling system outside of all liquid handling features. The excitation system 400 can be mounted to other positions that are stationary relative to the projection system PS, e.g. in between grid plates for an encoder based displacement measuring system. It is convenient to mount an electromagnetic excitation device to the fluid handling structure 12. By mounting the excitation device 400 to the fluid handling structure 12 it is always at a constant distance from the meniscus 33 ensuring a consistent effect.

Figure 6:
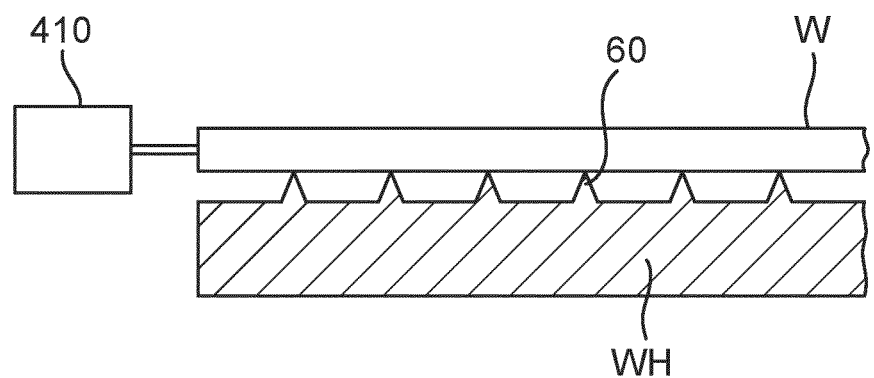
FIG. 6 depicts schematically an alternative excitation device usable in an embodiment.

An alternative form of excitation device 400 comprises a piezo-electric transducer 410 contacting an edge of the substrate W as depicted in FIG. 6. Such an arrangement can conveniently be integrated into the substrate support WT. Multiple such excitation devices can be provided.

Figure 7:
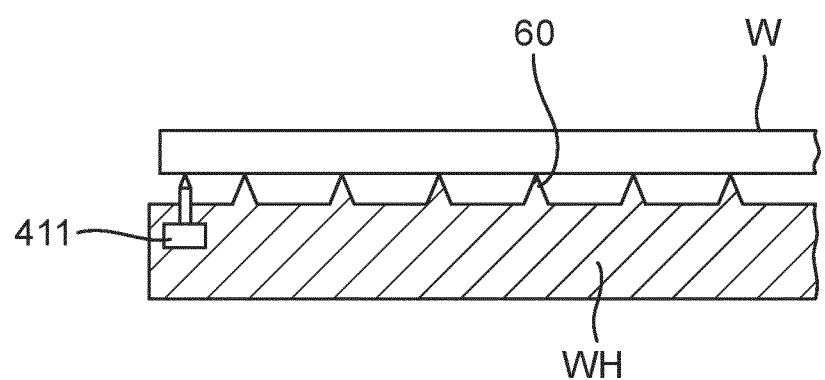
FIG. 7 depicts schematically another alternative excitation device usable in an embodiment.

A further alternative form of excitation device 400 comprises a piezo-electric transducer 411 integrated into a substrate holder WH (also known as the burl plate) as depicted in FIG. 7. In such an arrangement the piezo-electric transducer 411 can be connected to a burl 60 which supports the substrate W to couple vibrations into the substrate W. In an embodiment, the substrate holder WH forms an integral part of the substrate support WT, i.e., a single piece. Multiple such excitation devices can be provided.

Where a piezoelectric or other mechanical transducer is used to generate the surface acoustic waves 402 it is desirable to provide a coupling liquid dispenser configured to dispense a coupling liquid to couple the piezo-electric transducer to the substrate W. By using a coupling liquid direct contact between the substrate W and the transducer can be avoided, reducing wear and generation of particles.

A still further alternative form of excitation device 400 comprises a piezo-electric transducer integrated into the substrate W. A disadvantage of this alternative is that it takes up space on the substrate W that could otherwise be used to form devices and so reduces the number of devices that can be formed on each substrate W. However, the coupling of energy into the substrate W to form surface acoustic waves 402 is very efficient in the alternative. Multiple such excitation devices can be provided.

Desirably there are at least two, more desirable at least four excitation devices 400 spaced around the fluid handling system. With multiple excitation devices, a controller, e.g. controller 500, can be provided to control the excitation devices 400 in response to movement of the substrate holder WH. For example, it is sometimes desirable to operate each excitation device 400 when the substrate W is moving towards it, or has a component of its motion toward the excitation device 400. In this way, the surface acoustic waves 402 will propagate towards, or have a component of their direction of propagation towards, the trailing meniscus 33, which is most at risk of leaving droplets on the substrate W.

The optimal number of excitation devices 400 may depend on the movements performed by the substrate holder WH and its shape. In some cases, the movements which are most likely to leave droplets on the substrate W or the movements where droplets that are left are most problematic occur in a limited number of directions, e.g. + and −X or + and −Y, in which case two excitation devices 400 positioned to emit surface acoustic waves 402 propagating in the opposite directions may suffice. In other cases movements potentially causing droplets may occur in many directions and more excitation devices 400 are required. In some cases the fluid handling structure 12 may confine the immersion liquid 13 in such a manner that the meniscus 33 has multiple straight sides, e.g. four. In this case it may be desirable to provide sufficient excitation devises 400 and position them such that the surface acoustic waves 402 propagate towards the trailing side(s) of the meniscus 33 in a direction that is perpendicular to the meniscus 33. Such an arrangement ensures the energy of the surface acoustic wave 402 most efficiently directs immersion liquid 13 away from the meniscus 33.

A larger number of excitation devices 400 may enable beam forming techniques to be used to control the direction of propagation of the surface acoustic wave 402 more precisely.

In some cases the risk of droplet formation may be negligible unless the substrate holder WH is moving at greater than a predetermined speed, in which case it is desirable that the controller is configured to activate the excitation devices 400 if the speed of the substrate holder WH is greater than a predetermined threshold.

Although the effect of surface acoustic waves 402 in preventing droplet formation at the trailing meniscus 33 has been described above, surface acoustic waves 402 may also in some circumstances have a beneficial effect at the leading meniscus. A problem that can occur is that when the leading meniscus collides with droplets that have previously been left on the substrate W, bubbles may be formed in the immersion liquid and drift towards the centre of the immersion liquid. A bubble that enters the path of the radiation beam may cause an imaging error and hence a defect. Surface acoustic waves 402 propagating toward the leading meniscus may disrupt droplets on the surface of the substrate W in such a way as to reduce the probability of bubble inclusion in the immersion liquid. Alternatively or in addition, surface acoustic waves 402 propagating towards the leading meniscus may reduce the size of any droplets that are included into the immersion liquid. Smaller droplets are more likely to dissolve into the immersion liquid before reaching the radiation beam or less likely to cause an imaging error sufficient to cause a defect.

In most immersion lithographic apparatus, the immersion liquid will cross the edge of the substrate W during certain periods of the exposure cycle. If excitation devices 400 are mounted on the fluid handling structure 12, at these periods one of more of the excitation devices 400 may face the substrate support WT, rather than the substrate W. During some such periods it may be desirable to deactivate the relevant excitation devices 400, for example if they are close to a component such as a sensor that might be damaged by the surface acoustic waves 402 or the electromagnetic fields used to generate them. In other cases, the excitation devices 400 can continue operating and generate surface acoustic waves 400 in the surface of the substrate support WT instead of the substrate W. In some cases, depending on the material from which the substrate support WT is made, it might be desirable to provide a surface layer of a material in which surface acoustic waves 402 can be more easily generated.

The present invention may provide a lithographic apparatus. The lithographic apparatus may have any/all of the other features or components of the lithographic apparatus as described above. For example, the lithographic apparatus may optionally comprise at least one or more of a source SO, an illumination system IL, a projection system PS, a substrate support WT, etc..

Specifically, the lithographic apparatus may comprise the projection system PS configured to project the radiation beam B towards the region of the surface of a substrate W. The lithographic apparatus may further comprise the fluid handling system as described in any of the above embodiments and variations.

The lithographic apparatus may comprise an actuator configured to move the substrate W relative to the fluid handling system. Thus, the actuator may be used to control the position of the substrate W (or alternatively, the position of the fluid handling system). The actuator could be, or could comprise, the substrate support (e.g., a substrate table) WT and/or a substrate holder WH constructed to hold the substrate W and/or the second positioner PW configured to accurately position the substrate support WT.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Where the context allows, embodiments of the invention may be implemented in hardware, firmware, software, or any combination thereof. Embodiments of the invention may also be implemented by instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use ambient (non-vacuum) conditions.

Although specific reference may have been made above to the use of embodiments of the invention in the context of optical lithography, it will be appreciated that the invention, where the context allows, is not limited to optical lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A lithographic apparatus comprising:
   a substrate holder configured to hold a substrate,
   a projection system configured to project a radiation beam onto the substrate held by the substrate holder,
   a fluid handling system configured to confine immersion liquid to a space between a part of the projection system and a surface of the substrate so that the radiation beam can irradiate the surface of the substrate by passing through the immersion liquid, and
   an excitation device configured to generate surface acoustic waves in the substrate and propagating toward the immersion liquid.

2. The lithographic apparatus of claim 1, wherein the excitation device is configured to generate surface acoustic waves having a frequency greater than 1 MHz.

3. The lithographic apparatus of claim 1, wherein the excitation device comprises an electromagnetic device configured to generate eddy currents in the substrate and a static magnetic field parallel to the surface of the substrate.

4. The lithographic apparatus of claim 3, wherein the excitation device is mounted to the fluid handling system.

5. The lithographic apparatus of claim 1, wherein the excitation device comprises a piezo electric transducer contacting an edge of the substrate, integrated into the substrate holder or integrated into the substrate.

6. The lithographic apparatus of claim 5, further comprising a coupling liquid dispenser configured to dispense a coupling liquid to couple the piezo-electric transducer to the substrate.

7. The lithographic apparatus of claim 1, wherein there are at least four excitation devices spaced around the fluid handling system.

8. The lithographic apparatus of claim 7, further comprising a positioning system configured to move the substrate holder relative to the projection system in a plane substantially parallel to the surface of the substrate, and a controller configured to control the excitation devices in response to movement of the substrate holder.

9. The lithographic apparatus of claim 8, wherein the controller is configured to activate the excitation devices if the speed of the substrate holder is greater than a predetermined threshold and/or wherein the controller is configured to selectively activate one or more of the excitation devices to generate surface acoustic waves that propagate in a direction having a component opposite in direction to the direction of movement of the substrate holder.

10. A device manufacturing method in a lithographic apparatus having a substrate holder configured to hold a substrate, a projection system configure to project a radiation beam onto the substrate held by the substrate holder, and a fluid handling system configured to confine immersion liquid to a space between a part of the projections system and a surface of the substrate so that the radiation beam can irradiate the surface of the substrate by passing through the immersion liquid, the method comprising:
   using the liquid confinement structure to confine immersion liquid to the space between at least a part of the liquid confinement structure and the surface of the substrate;
   projecting a patterned beam of radiation onto the substrate through the immersion liquid in the space;
   moving the substrate in a movement direction substantially perpendicular to a direction of propagation of the radiation beam; and
   generating surface acoustic waves in the substrate that propagate toward the immersion liquid.

11. The method according to claim 10, wherein the surface acoustic waves are generated to propagate in a direction that has a component anti-parallel to the movement direction.

12. The method of claim 10, wherein the surface acoustic waves have a frequency greater than 1 MHz.

13. The method of claim 10, wherein the surface acoustic waves are generated by generating eddy currents in the substrate and applying a static magnetic field parallel to the surface of the substrate.

14. The method of claim 10, further comprising generating the surface acoustic waves using an excitation device mounted to the fluid handling system.

15. The method of claim 10, wherein the surface acoustic waves are generated by generating the surface acoustic waves using a piezo electric transducer contacting an edge of the substrate, integrated into the substrate holder or integrated into the substrate.

16. The method of claim 15, further comprising dispensing a coupling liquid to couple the piezo-electric transducer to the substrate.

17. The method of claim 10, further comprising generating the surface acoustic waves using at least four excitation devices spaced around the fluid handling system.

18. The method of claim 17, further comprising controlling the excitation devices in response to movement of the substrate.

19. A system comprising:
   a substrate holder configured to hold a substrate for immersion lithography using an immersion liquid in contact with the substrate or a fluid handling system configured to confine immersion liquid to a space between a part of a projection system and a surface of a substrate for immersion lithography, and
   an excitation device configured to generate surface acoustic waves in the substrate and propagating toward the immersion liquid.

20. The system of claim 19, comprising the fluid handling system.

21. The system of claim 19, comprising the substrate holder.

* * * * *